United States Patent

[11] 3,633,076

[72] Inventors Heinz-Herbert Arndt
Nurnberg;
Jurgen Schadel; Dieter Muller, both of Erlanger, all of Germany
[21] Appl. No. 624,580
[22] Filed Mar. 20, 1967
[45] Patented Jan. 4, 1972
[73] Assignee Siemens Aktiengesellschaft
Berlin and Munich, Germany
[32] Priority Mar. 19, 1966
[33] Germany
[31] S 102622

[54] THREE LAYER METALLIC CONTACT STRIP AT A SEMICONDUCTOR STRUCTURAL COMPONENT
4 Claims, 5 Drawing Figs.

[52] U.S. Cl. .......... 317/234 R, 317/234 M, 317/234 L
[51] Int. Cl. .......... H01l 1/14
[50] Field of Search .......... 317/234 (5), 234 (5.3)

[56] References Cited
UNITED STATES PATENTS

| | | | |
|---|---|---|---|
| 3,341,753 | 9/1967 | Cunningham .......... | 317/234 |
| 3,270,256 | 8/1966 | Mills .......... | 317/234 |
| 2,973,466 | 2/1967 | Atalla .......... | 317/240 |
| 3,290,753 | 12/1966 | Chang .......... | 29/25.3 |
| 3,370,207 | 2/1968 | Fabel .......... | 317/234 |

*Primary Examiner*—John W. Huckert
*Assistant Examiner*—Martin H. Edlow
*Attorneys*—Curt M. Avery, Arthur E. Wilfond, Herbert L. Lerner and Daniel J. Tick

ABSTRACT: The method of applying a metallic contact strip to a semiconductor and the strip per se. The contact strip consists of three sequential layers of different metals stacked upon each other. The lowest layer, i.e., that adjacent the semiconductor, possesses a high affinity toward oxygen and is preferably selected from molybdenum, tungsten, vanadium and chromium. The middle layer is selected from iron, cobalt, nickel, manganese and chromium. The outer layer is a noble metal.

THREE LAYER METALLIC CONTACT STRIP AT A SEMICONDUCTOR STRUCTURAL COMPONENT

In the production of structural semiconductor components, metallic layers are used to provide a perfect ohmic current transfer between the lead wires and the various regions of the semiconductor. Furthermore, in "integrated" circuits, these metal layers also provide the connection between various structural components within a small semiconductor plate, and are led across an insulated layer (for example $SiO_2$). Frequently, it is also necessary to use the metal for dissipating the heat losses occurring in the semiconductor.

The following requirements must be met by the contacts:

a. The contact material must have good conductivity and a small ohmic transfer resistance to the semiconductor material (electrical properties).

b. The material must adhere well with good mechanical stability to both the semiconductor material and the respective insulating materials (mechanical properties).

c. The material should be easy to apply and easy to process by photolithographic methods (workability).

d. The material should lend itself to soldering or brazing (hard or soft) as well as permitting the attaching of wires by thermocompression (contacting ability).

e. Changes in the material should not occur during the processing or operation. Changes such as, for example, by reaction of the materials or corrosion result in an impairment of the electrical or mechanical properties. A reaction with the semiconductor material must be limited to the actual contacting surface of the semiconductor metal (chemical characteristics, stability).

The contact material, especially for "integrated" semiconductor circuits, may be aluminum. Aluminum ideally meets requirements (a), (b) and (c). It is, however, not solderable, i.e., it does not permit large area contacts and soldering of wires. Furthermore, aluminum reacts, for example, at 200°–300° C. with gold wire which is frequently used. This reaction may render the structural components unusable.

Also, a nickel layer may be used in silicon semiconductor components. Nickel meets well requirements (a) and (c), but does not adhere very tightly to the polished silicon or to the $SiO_2$ surface. Furthermore, contacting of wires by thermocompression is not assured.

It is also possible, for example in solar generators, to use a layer of titanium, covered by silver. This double layer fulfills the requirements (a), (b) and (d). However, processing by means of photolithography is very difficult.

It is also known to use a double layer wherein molybdenum constitutes the lower metal and gold constitutes the cover layer. This double layer meets requirements (a), (b), (d) and (e); but only when the molybdenum layer is thicker than 0.2 $\mu$. When the molybdenum layer is less than 0.2 $\mu$, the covering gold layer may penetrate the molybdenum layer and alloy with the underlying silicon, even at 370° C. However, the production of such thick molybdenum layers entails a considerable expense as the vapor pressure of molybdenum is so very low that very high temperatures are needed over prolonged periods of time, to vaporize a sufficient amount of molybdenum. Even when employing cathode spattering, it is difficult to apply thick layers of molybdenum, as the layer frequently possesses inner stresses which flake off the molybdenum. There is also a constant danger that the gold would alloy through the pores in the molybdenum, even using layers more than 0.2 $\mu$ thick. Thus, in addition to its complicated production, the use of such a double layer entails considerable risk.

Summarizing, it had not been possible to find a single material which would meet all qualifications. Furthermore, the requirements contradict each other. For example, a material having a high affinity for oxygen would be well suited for its good adhesive strength, however a low tendency to corrosion would be in materials with a particularly low affinity to oxygen. Even the use of double layers had not yet led to a desired result. As the suitable cover metals Ag, Au or Pt undesirably react with the semiconductor material, the lower layer in a double layer must always be absolutely free of pores.

That is, the lower layer must be applied as a relatively thick layer. The most favorable lower metals possess great technological difficulties in accomplishing this.

It is an object of the present invention to produce contacts which simultaneously meet all five established requirements. The present invention relates to a metallic contact on a structural semiconductor component. Electrical leads are easily attached to the contact which can serve as a conductive connection between the individual regions of the structural component. The contact of the present invention comprises three different metal layers, stacked upon each other and adapted to be processed by means of the photoresist method. The lower layer resting on the semiconductor body has a high oxygen affinity relative to the outer layer and is preferably selected from molybdenum, tungsten, vanadium or chromium, the center layer comprises iron, cobalt, nickel, manganese or chromium and the outer, uppermost layer consists of noble metals, particularly of gold, silver or platinum.

The lower layer is usually thinner than 1 $\mu$ and is preferably 0.01 to 0.05 $\mu$. The middle layer is usually thicker than 0.05 $\mu$ and may be between 0.1 and 0.2 $\mu$ thick. The upper layer has a thickness between 0.1 and 1.5 $\mu$, particularly between 0.5 and 1 $\mu$. The layers may be applied by vapor depositing, by cathode spattering, by galvanic immersion or by immersion without current.

The metal sequence of the metallic contact area according to the present invention has many variations which meet all requirements. A key advantage of our three layer method is that each individual metal must meet a few requirements only. Only requirement (c), concerning the workability by means of the photoresist method, must be met by all three layers. The region of the semiconductor disc upon which the lower metal layer is applied is preferably doped up to degeneration. This makes the ohmic transfer resistance between the semiconductor material and the contact very small, particularly relative to the resistance of the contact material and the terminal leads.

Only the first layer should still have good adhesive strength with the semiconductor and the insulation materials. Experience has shown that metals adhere well to each other, particularly if they are vapor deposited in a sequence, without interrupting the vacuum. Other requirements are largely eliminated for the first layer. The layer may be very thin, since pores are, in any case, covered by the second layer. The first layer of the invention may thus be a substance which is hard to vaporize.

As a second layer, a material may be chosen which is much easier to evaporate. It should not react in an undesirable manner with the semiconductor material or with the insulating material. On the other hand, it need not be very resistant to corrosion or very easy to contact.

The third upper layer may be selected in accordance with the last mentioned point of view. That is, without consideration of possible reactions with the semiconductor material, as this is not possible due to the two layers lying below. However, no reactions should take place with the center layer, or at least no reactions which may have detrimental effects upon the electrical or mechanical properties of the contact system should occur.

A metal having a high affinity to oxygen is suitable as the first metal. Illustrative thereof are Mo, W, V, Cr. These metals form small ohmic resistances toward the semiconductor material, particularly if the semiconductor material beneath it is doped at least to "degeneration". The layer thickness is, as a rule, below 0.1 $\mu$, preferably between 0.01 and 0.05 $\mu$. It is appropriate to heat the semiconductor body during evaporation to 200°–500° C., thus improving the adhesive strength.

Fe, Co, Ni, Mn or Cr are suitable as the second layer. Chromium is suitable only if it had not been used as the first layer. The layer thickness should be over 0.05 $\mu$ and preferably between 0.1 and 0.2 $\mu$.

A noble metal, preferably Ag, Au or Pt, is desirable for the third, upper layer. The layer thickness may be between 0.1 and 1.5 $\mu$, preferably to 0.5 to 1 $\mu$, corresponding to the longitudinal conductivity parallel to the semiconductor surface (particularly in integrated semiconductor circuit arrangements). Layers which are thicker than 1.5 μ usually have a tendency toward peeling. In using Ag it is preferable to keep the temperature of the semiconductor below 200° C., during the vapor depositing process. Preferably, the contact surface of the invention is so produced that the three layers are applied in sequence, by means of vacuum vaporization or cathode spattering, without interrupting the vacuum. The vacuum should not be interrupted, particularly to prevent an oxide skin or film from forming upon it following the application of the first, the second, or any other layer which may impair the adhesive strength of the next sequential layer. In order to obtain good adhesive strength it is advisable to heat the semiconductor material to a temperature between 200° and 500° C., during the application of one or several layers, particularly the two lower metal layers.

The invention will be disclosed in greater detail with reference to specific embodiments and the drawings, which are not true to scale. In the drawings, FIGS. 1 to 3 show a semiconductor disc upon which the three metal layers are applied in three method steps;

Figure 1:
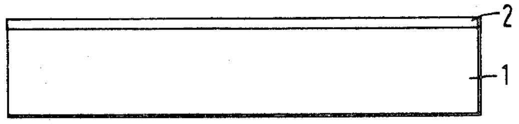
Figure 2:
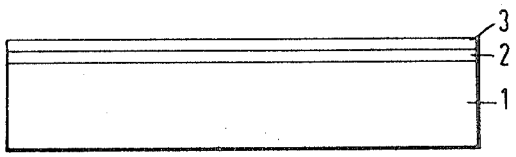
Figure 3:
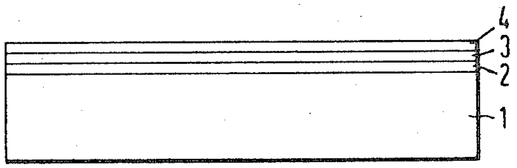

FIG. 1 shows in cross section a semiconductor disc 1 and a metal layer 2 applied upon it. This metal layer may be burned or heated into the semiconductor body prior to or during the application of additional metal layers, so that said layer will adhere tightly. FIGS. 2 and 3 show two other method steps by which layers 3 and 4 are applied in sequence upon layer 2 by means of vaporization cathode spattering, or by galvanic or current-free means. The two upper layers, generally, are not burned in.

Figure 4:
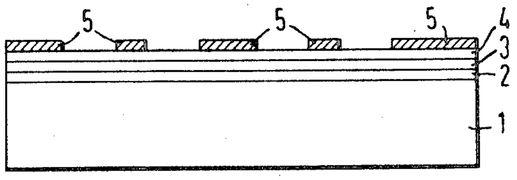
FIG. 4 shows a semiconductor disc according to FIG. 3, whereon a photoresist pattern is produced.

FIG. 4 shows a semiconductor disc according to FIG. 3, whereon a photoresist pattern 5 is produced. During etching of the surface of the disc of FIG. 4, only those regions of the disc will be attacked which contact no photoresist. Thus, contacts separated from each other and connected only by means of semiconductor material may be produced on a semiconductor body. Furthermore PN-junctions which are possibly present in the semiconductor material may be freed in this way.

Figure 5:
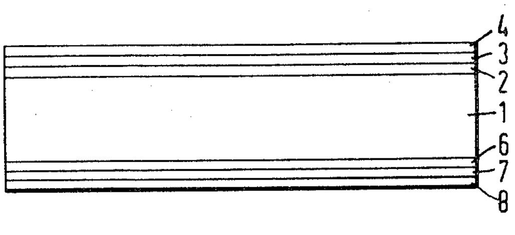
FIG. 5 shows a semiconductor disc whose upper and lower side was provided with three metal layers.

FIG. 5 shows that the contact surface of the invention may also be produced on both surfaces of the semiconductor disc. In the figure, the lower metal layers 6 to 8 should also be assumed to have been simultaneously applied in the same manner as the corresponding three upper layers 2 to 4. In a similar way, the semiconductor disc may also be contacted at the edges.

As a specific example, a silicon disc was coated sequentially with molybdenum, nickel and silver. The molybdenum layer was about 0.05 μ thick. During the evaporation of the molybdenum, the silicon disc was heated to 300° C. A nickel layer 0.1 μ thick was applied while the silicon disc was being cooled. After the temperature of the silicon was further reduced, below 200° C., silver was vapor deposited up to a thickness of 0.5 μ. This layer may be etched by means of the photoresist method, for example according to FIG. 4. Gold or silver wires or the like may be attached, without any difficulty, to the finished contact surface by thermocompression. Contacting by brazing or soldering is just as easily possible.

We claim:

1. A metallic contact strip for a structural semiconductor component for the application of electrical leads and/or as a conductive connection between individual regions of the structural component, which consists of three different metal layers stacked upon each other and processed by means of the photoresist method, the lowest layer applied at the semiconductor body possessing a high affinity to oxygen relative to the outer layer and being selected from the group consisting of tungsten, vanadium and chromium, the middle layer being selected from iron, cobalt, nickel, manganese and chromium and the upper, outer layer consisting of a noble metal, the middle layer being of a different material than the lower layer.

2. Metallic contact strip according to claim 1, wherein the thickness of the lower layer is less than 0.1 μ.

3. The contact strip of claim 2, wherein the lower layer is between 0.01 and 0.05 μ thick.

4. The metallic contact strip according to claim 3, wherein the lower metal layer bears upon semiconductor material which is doped to degeneracy.

* * * * *